United States Patent [19]

DuPont et al.

[11] Patent Number: 5,796,390
[45] Date of Patent: Aug. 18, 1998

[54] REDUNDANT SHIFT REGISTERS FOR SCANNING CIRCUITS IN LIQUID CRYSTAL DISPLAY DEVICES

[75] Inventors: Antoine Pierre DuPont, VS-Villingen, Germany; Dora Plus, South Bound Brook, N.J.

[73] Assignee: Thomson, S.A., Courbevoie, France

[21] Appl. No.: 37,175

[22] Filed: Mar. 24, 1993

Related U.S. Application Data

[63] Continuation of Ser. No. 660,274, Feb. 28, 1991, abandoned.

[51] Int. Cl.$^6$ .................................................. G09G 3/36
[52] U.S. Cl. ........................... 345/204; 345/93; 345/100
[58] Field of Search .................................. 340/718, 719, 340/784, 800, 805, 811; 345/93, 100, 204, 205, 206

[56] References Cited

U.S. PATENT DOCUMENTS 4,633,242 12/1986 Sekiya ..................................... 340/719
5,063,378 11/1991 Roach ..................................... 340/784
5,136,622 8/1992 Plus ......................................... 377/64

FOREIGN PATENT DOCUMENTS 0179391 8/1991 Japan ..................................... 340/811

Primary Examiner—Jeffery Brier
Attorney, Agent, or Firm—Joseph S. Tripoli; Eric P. Herrmann

[57] ABSTRACT

A display device having a plurality of select lines includes redundant select line scanners. Each scanner includes a plurality of substantially identical stages having an input terminal and an output terminal. The stages and select lines are ordinally numbered and correspondingly numbered stages are connected to opposite ends of the correspondingly numbered select lines by separate line segments. The stages within each scanner are cascaded by connecting the output terminal of each stage to the input terminal of the immediately succeeding stage. Failed stages of a scanner are replaced by the correspondingly numbered stage of the other scanner simply by opening the separate line segment of the failed stage.

5 Claims, 3 Drawing Sheets

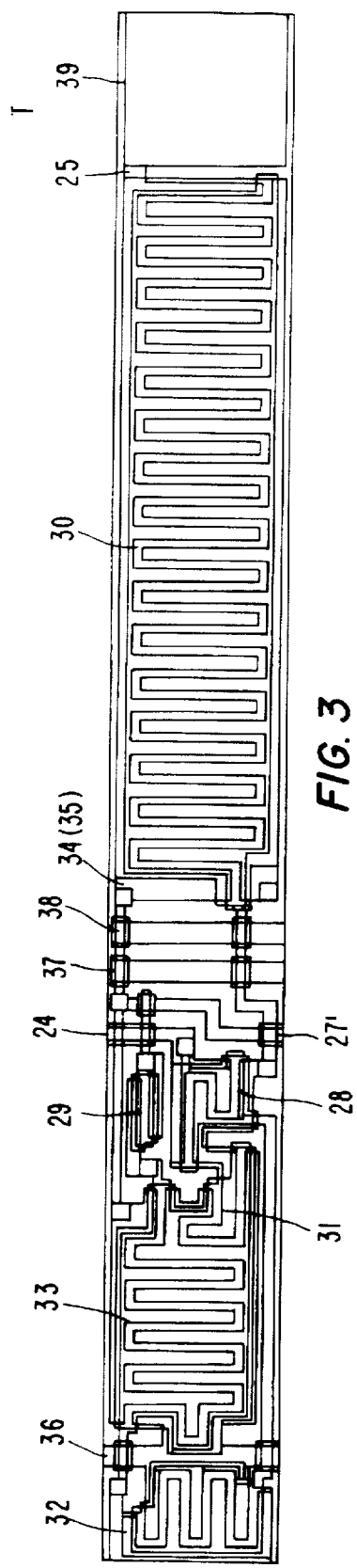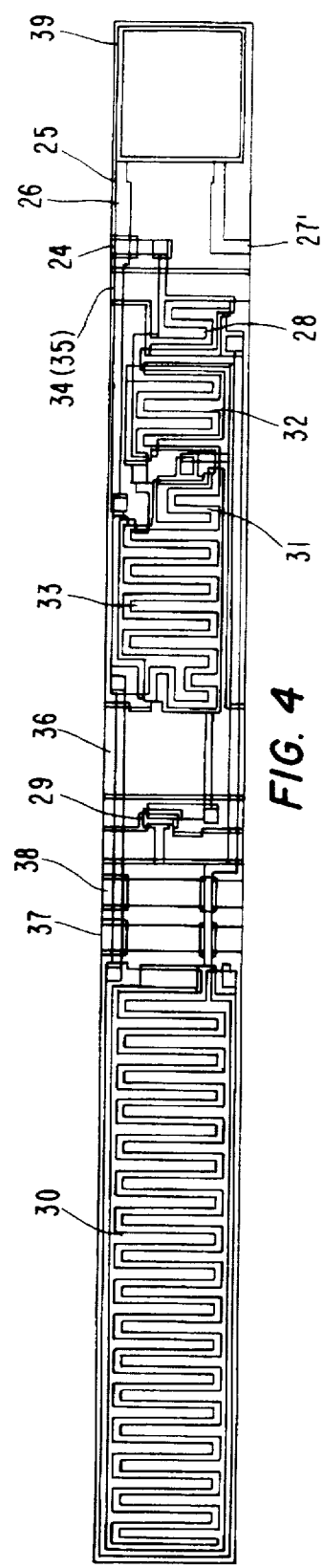

REDUNDANT SHIFT REGISTERS FOR SCANNING CIRCUITS IN LIQUID CRYSTAL DISPLAY DEVICES

This is a continuation of application Ser. No. 07/660274 filed Feb. 28, 1991 now abandoned.

BACKGROUND

This invention relates generally to shift registers and particularly to redundant shift registers for scanned devices, such as liquid crystal displays.

Liquid crystal television and computer displays are known in the art. A simplified prior art liquid crystal display is shown in FIG. 1.

The display includes an array of liquid crystal elements 11 arranged in rows and columns. Each liquid crystal element is associated with a switching device 12, such as a thin film transistor (TFT). The gate of each TFT 12 is connected to a select line 13 so that a complete row of TFT's is simultaneously biased by each select line 13. The select lines 13 are individually connected to the output terminals 17 of a select line scanner 18, which provide the biasing voltages to the select lines. The drain of each TFT is connected to a data line 14 which provides a grey scale (brightness) signal to the liquid crystal element 11 associated with a biased TFT 12. The data lines 14 are individually connected to the output terminals 15 of a data line scanner 16.

Select line scanner 18 is a shift register having a stage for each of the select lines 13, and the select lines 13 are sequentially voltage biased by the individual stages of the scanner. The brightness signals are simultaneously applied to all of the data lines 14 by a data line scanner 16 so that all liquid crystal elements 11 associated with the biased select line are simultaneously charged to various voltages in accordance with the brightness signals received from data line scanner 16. The TFT's 12, data line scanner 16 and select line scanner 18 preferably are fabricated on the same substrate, with the scanners 16 and 18 lying along the periphery of the substrate.

Liquid crystal displays for television and computer monitors have a large number of columns of liquid crystal cells, for example, 1,440. A display with this number of columns and having the standard 3×4 aspect ratio would have approximately 1,080 select lines. A display device with this number of select lines and data lines would include approximately 1.56 million TFT's 12. Select line scanner 18 would include 1,080 stages and data line scanner 16 would include 1,440 stages. Because of this large number of elements, the manufacturing yield of acceptable displays tends to be low. Therefore, there is a need for a provision to increase the yield of such display devices. The present invention addresses this need by the provision of redundant select line scanners fabricated from solid state devices having a unique layout wherein a failed stage of one scanner can be replaced by the corresponding stage of the other scanner by the opening of a specially provided separate line segment which is included in each stage of both of the redundant scanners.

CROSS-REFERENCE TO RELATED APPLICATIONS

The present invention can be used with the invention described in application Ser. No. 660,272( ) now U.S. Pat. No. 222,082 filed concurrently herewith by Dora Plus and titled "Shift Register Useful As A Select Line Scanner For A Liquid Crystal Display".

The present invention can be used with the invention described in application Ser. No. 660,271( ) now U.S. Pat. No. 5,136,622 filed concurrently herewith by Dora Plus and titled "Shift Register, Particularly For A Liquid Crystal Display"

This application is related to the invention described in application Ser. No. 660,273 now U.S. Pat. No. 5,224,102 filed concurrently herewith by Dora Plus and Antoine DuPont and titled "Design And Test Methodology For Redundant Shift Registers"

SUMMARY

A display device having an array of display elements arranged in rows and columns includes means for applying data signals to the columns of elements, and a plurality of select lines for voltage biasing the rows of elements. Redundant select line scanners sequentially select the select lines. Each of the scanners includes a plurality of ordinally numbered stages having an input terminal and an output terminal. The input terminal of each stage is connected to the output terminal of the immediately preceding stage. Separate line segments connect the output terminals of correspondingly numbered stages to opposite ends of correspondingly numbered select lines, whereby a failed stage of one scanner can be replaced by the correspondingly numbered stage of the other scanner by opening the separate line segment associated with the failed stage.

BRIEF DESCRIPTION OF THE DRAWINGS

FIG. 3 is a layout of one stage of a select line scanner which is laid out in accordance with the typically used techniques of laying out solid state circuitry.

FIG. 4 is a preferred embodiment of a layout of a select line scanner stage in accordance with the present invention.

DETAILED DESCRIPTION

Figure 2:
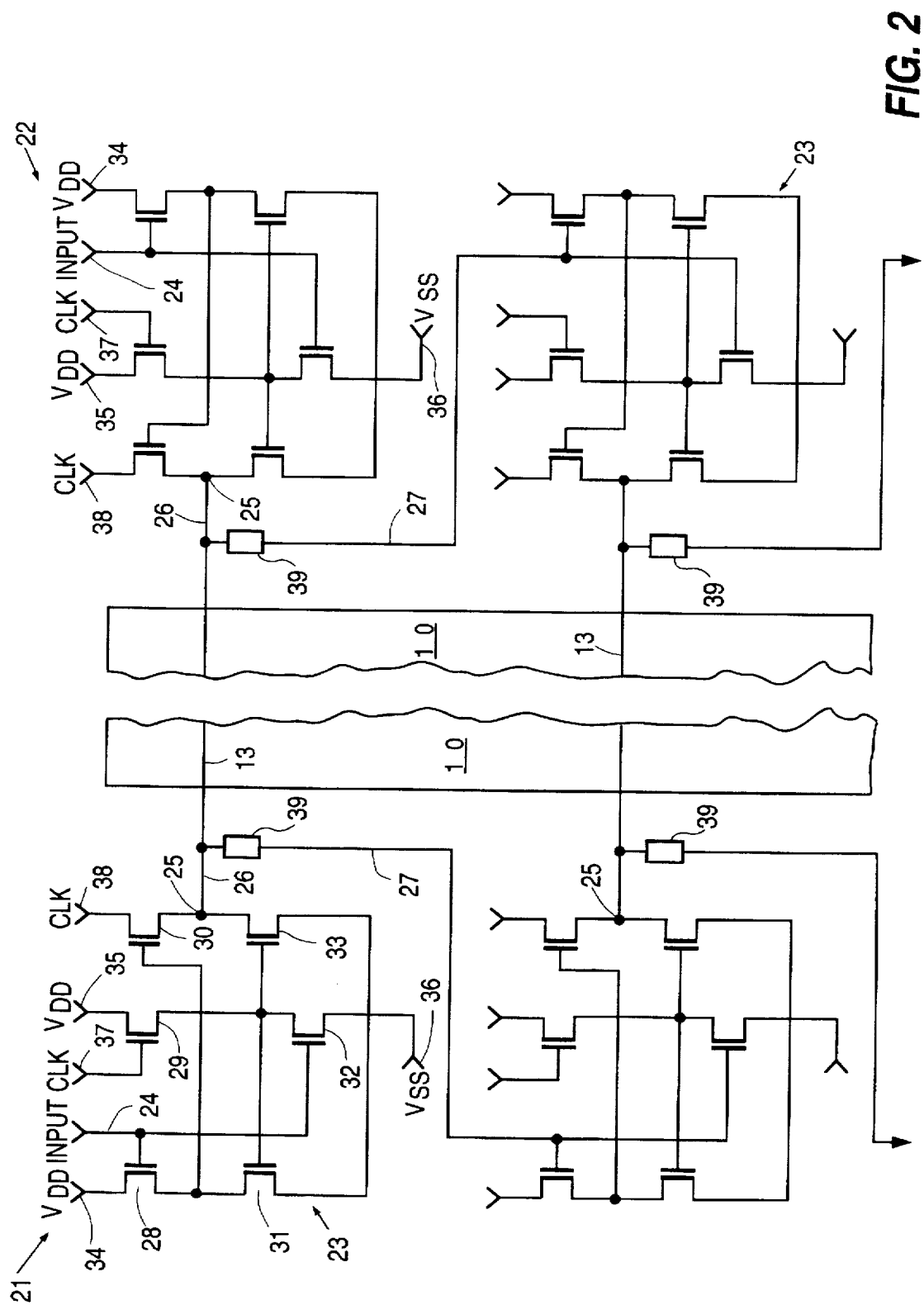
FIG. 2 is a preferred embodiment of a display (with the crystal array broken away) including a schematic of the cascaded stages of redundant select line scanners.

In FIG. 2, the crystal array 10 is shown broken away for convenience of illustration of the select line scanner stages. Redundant select line scanners 21 and 22 are comprised of a plurality of identical stages 23 each having an input terminal 24 and an output terminal 25. Each stage 23 also includes biasing terminals 34, 35, and 36, and clock terminals 37 and 38. Different power supplies and clock generators (not shown) provide the biasing voltages and clock signals to the select line registers 21 and 22. The stages 23 are described in detail in U.S. Pat. No. 5,222,082. The stages 23 of select line scanners 21 and 22 and the select lines 13 are ordinally numbered and correspondingly numbered stages of scanners 21 and 22 are coupled to opposite ends of correspondingly numbered select lines 13 by separate line segments 26. The separate line segments 26 also connect the output terminals 25 of the respective stages to the input terminals 24 of the immediately succeeding stages via lines 27.

In operation, the select fire scanners 21 and 22 are operated synchronously and the production of an output pulse by one stage provides an input pulse to the immediately succeeding stage and also voltage biases the associated select line 13. A stage which is faulty for any reason can be removed from the system simply by opening the separate line segment 26 of the faulty stage and the correspondingly numbered stage of the other scanner provides the input pulse to the succeeding stage of both scanners 21 and 22.

Figure 1:
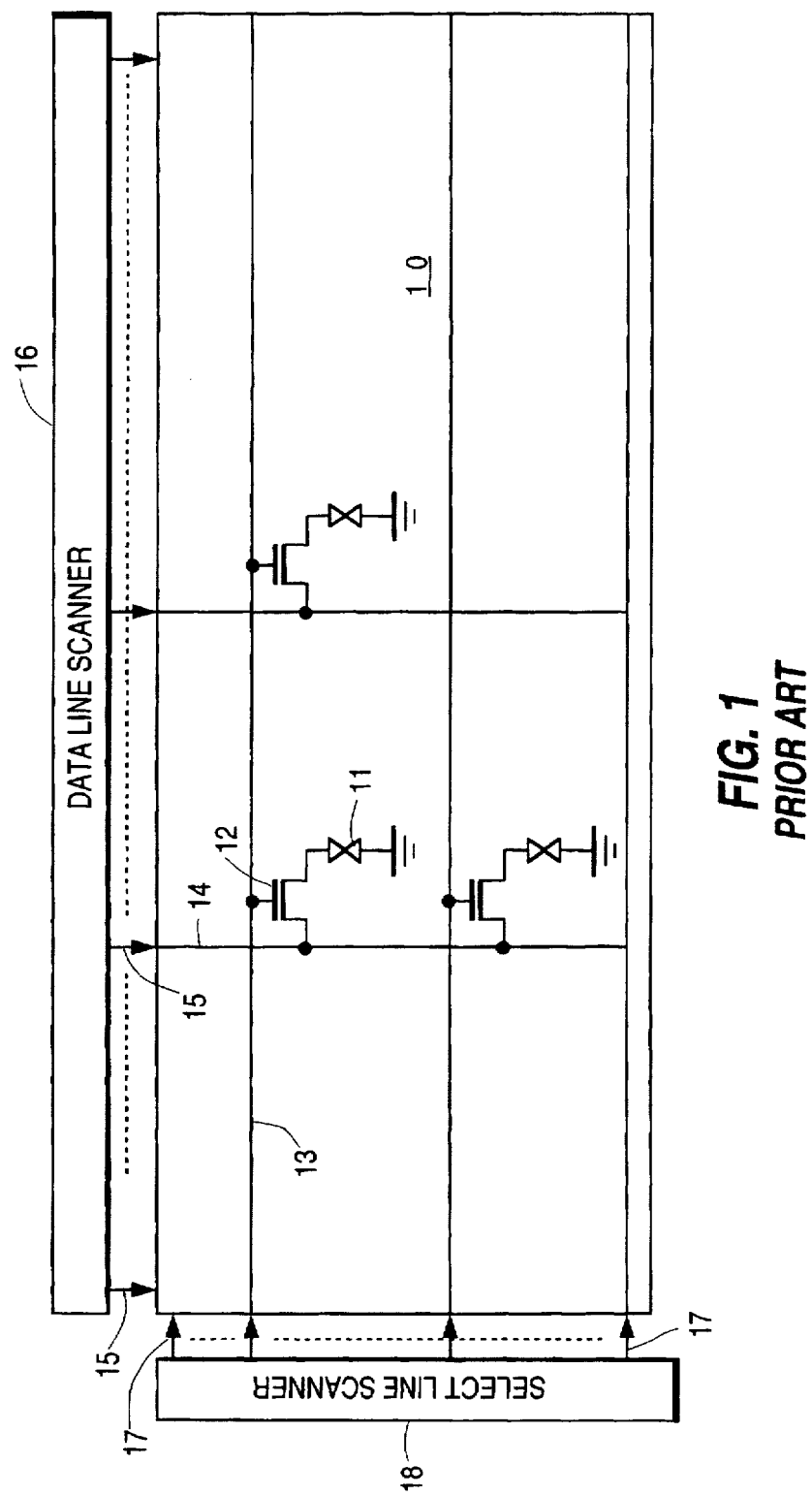
FIG. 1 is simplified showing of a prior art type of liquid crystal display.

Every stage 23 of both select line scanners 21 and 22 is comprised of six TFT's 28 through 33. The TFT's 28 through 33 preferably are fabricated on the same substrate as the TFT's 12 (FIG. 1) and at the same time that the TFT's 12 are fabricated. FIG. 3 shows a greatly enlarged layout for the six transistors 28 through 33 in one of the stages 23, which results when typically employed circuit layout techniques are used. Typically, when laying out solid state circuitry the input devices and input terminal are arranged at an input section, and the output devices are arranged in an output section in the proximity of the output terminal 25, the input and output terminals are therefore remote from one another. A test pad 39 provides space to place a test probe because the lines in the solid state circuit are microns wide and therefore can not be conveniently connected to test equipment In FIG. 3, output transistor 30 is arranged on one side of terminals 34, 37 and 38 in the proximity of output terminal 25 and test pad 39. The other solid state devices 28, 29, 31, 32 and 33 and terminal 36 are arranged on the other side of terminal 34, 37 and 38. Also, terminal 27', which is connected to line 27 to apply the output signal to the input terminal of the immediately succeeding stage, is arranged immediately between input terminal 24 and clock terminal 37, terminals 25 and 27' are electrically connected. With the layout shown in FIG. 3 the technique of isolating faulty stages of a data line scanner by opening a separate line segment 26 cannot be utilized because there is no way to provide the separate line segment and there is no line which can be opened to serve the same purpose. Thus, with the layout of FIG. 3, if any of the stages 23 includes a defect of any type the defective stage cannot be isolated from the select line scanner, and the device must be scrapped if it can not be repaired.

FIG. 4 is a preferred layout in which the test pad 39 is arranged at one end of the substrate upon which the solid state circuit is fabricated. Input terminal 24, output terminal 25, separate line segment 26 and terminal 27' are arranged in the immediate vicinity of test pad 39. The TFT's 28 through 33 are arranged on the side of the input and output terminals opposite from that of test pad 39. Input and output terminals 24 and 25 therefore, are between the solid state devices and test pad 39. With the configuration of FIG. 4, any type of failure, in any element of the stage, can be circumvented because the defective stage can be isolated from the other register stages simply by making an opening in the separate line segment 26 of the failed stage using a laser, a technology well established in the art. The FIG. 4 configuration is substantially different from configurations resulting from the use of typical layout techniques because the output device 30 is remote from the output terminal 25, and because the input and output terminals are in the close proximity of one another.

The invention has several significant advantages. A common failure in the manufacture of the liquid crystal arrays is shorts between the select lines and data lines where they cross one another. With the invention, the problem of such shorts can be corrected simply by opening the shorted select line on both sides of the short. The data line remains conductive throughout its full length, and the two portions of the select line are biased by the respective register stages with which they are associated.

Another manufacturing problem is openings in the select lines. With the invention this problem is significantly reduced because a single opening in a particular select line does not render the line nonconductive, the two portions of the open line are biased by the respective register stages with which they are associated and all liquid crystal cells connected to the open line receive a biasing voltage.

It is possible for a short to occur in the input section of a stage and short the clock terminal to the input terminal. This condition can be detrimental to the preceding stage even after the separate line segment 26 is opened. With the inventive layout, this detriment is corrected by opening the separate line segment 26 of the failed stage, and the terminal 27' of the immediately preceding stage, and the failed stage is then completely isolated from both of the registers.

What is claimed is:

1. A display device having an array of display elements arranged in rows and columns, means for applying data signals to said columns of elements, and a plurality of select lines for voltage biasing said rows of elements, said display device comprising:

redundant select line scanners for sequentially selecting said select lines, each of said scanners including a plurality of ordinally numbered stages having an input terminal and an output terminal, the input terminal of each stage being connected to the output terminal of the immediately preceding stage;

separate line segments directly connecting the output terminals of correspondingly numbered stages of said scanners to opposite ends of correspondingly numbered select lines and connected to the input terminals of the immediately succeeding stages whereby a failed stage of one scanner can be replaced by the correspondingly numbered stage of the other scanner by opening the separate line segment associated with the failed stage.

2. The display device of claim 1 wherein said select line scanners are arranged on opposite sides of said display device.

3. The device of claim 2 wherein said input terminal and said output terminal are arranged in the close proximity of one another.

4. The device of claim 1 wherein said input terminal and said output terminal are arranged in the close proximity of one another.

5. A display device having an array of display elements arranged in rows and columns, means for applying data signals to said columns of elements, and a plurality of select lines for voltage biasing said rows of elements, said display device comprising:

first and second select line scanners, each of said scanners having a plurality of sequentially numbered stages, each stage having an input terminal and an output terminal;

a first set of separate line segments directly connecting the output terminal of each stage within said first select line scanner to a first end of a similarly numbered select line, a second set of separate line segments directly connecting the output terminal of each stage within said second select line scanner to a second end of a similarly numbered select line; and a first set of conductors connecting said first ends of said select lines to the input terminals of the immediately succeeding stages within said first select line scanner, and a second set of conductors connecting said second ends of said select lines to the input terminals of the immediately succeeding stages within said second select line scanner.

\* \* \* \* \*